(12) United States Patent
Liu et al.

(10) Patent No.: US 12,382,675 B2
(45) Date of Patent: Aug. 5, 2025

(54) SEMICONDUCTOR DEVICE AND MANUFACTURING METHOD THEREOF

(71) Applicant: CSMC TECHNOLOGIES FAB2 CO., LTD., Wuxi (CN)

(72) Inventors: Teng Liu, Wuxi (CN); Nailong He, Wuxi (CN); Lihui Gu, Wuxi (CN); Sen Zhang, Wuxi (CN); Wentong Zhang, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 18/867,459

(22) PCT Filed: Apr. 6, 2023

(86) PCT No.: PCT/CN2023/086693
§ 371 (c)(1),
(2) Date: Nov. 20, 2024

(87) PCT Pub. No.: WO2024/001394
PCT Pub. Date: Jan. 4, 2024

(65) Prior Publication Data
US 2025/0176230 A1   May 29, 2025

(30) Foreign Application Priority Data

Jun. 30, 2022  (CN) .......................... 202210757089.0

(51) Int. Cl.
*H10D 62/10*     (2025.01)
*H10D 30/01*     (2025.01)
*H10D 30/65*     (2025.01)

(52) U.S. Cl.
CPC ....... *H10D 62/102* (2025.01); *H10D 30/0281* (2025.01); *H10D 30/655* (2025.01)

(58) Field of Classification Search
CPC . H10D 62/102; H10D 30/0281; H10D 30/655
See application file for complete search history.

(56) References Cited

U.S. PATENT DOCUMENTS

2004/0121547 A1\* 6/2004 Lee ...................... H10D 86/201
                                                              257/E27.06
2013/0134511 A1   5/2013 Yang et al.
(Continued)

FOREIGN PATENT DOCUMENTS

CN          102208450 A    10/2011
CN          102306656 A    1/2012
(Continued)

*Primary Examiner* — Syed I Gheyas
(74) *Attorney, Agent, or Firm* — IPRTOP LLC

(57) ABSTRACT

The semiconductor device comprises a high-voltage device region, a low-voltage device region, and an isolation region. It further comprises a drift region, a second conductivity type well region, an isolation well region, an isolation structure, a power device source region, and a power device drain region. The drift region is disposed in the high-voltage device region. The second conductivity type well region is disposed in the isolation region and extends to the low-voltage device region. The isolation well region is disposed in the drift region and separates the drift region into a high-voltage drift region and a power device drift region. The isolation structure is disposed in the isolation well region. The power device source region is disposed in the isolation region and located in the second conductivity type well region, and the power device drain region is disposed in the power device drift region.

15 Claims, 3 Drawing Sheets

(56) References Cited

U.S. PATENT DOCUMENTS

2018/0350978 A1\* 12/2018 Kim .................... H10D 62/105
2020/0343145 A1\* 10/2020 Kang ................. H10D 30/0227

FOREIGN PATENT DOCUMENTS

| CN | 104134661 A | 11/2014 |
| CN | 110875310 A | 3/2020 |
| CN | 114823872 A | 7/2022 |

\* cited by examiner

```
┌─────────────────────────────────────────────────────────────┐
│ forming a drift region in a high-voltage device region,     │──S210
│ wherein the drift region has a first conductivity type      │
└─────────────────────────────────────────────────────────────┘
                              ↓
┌─────────────────────────────────────────────────────────────┐
│ forming a second conductivity type well region in an        │
│ isolation region, with the second conductivity type well    │
│ region extending into a low-voltage device region, and      │
│ forming an isolation well region in the drift region to     │──S220
│ separate the drift region into a high-voltage drift region  │
│ and a power device drift region                             │
└─────────────────────────────────────────────────────────────┘
                              ↓
┌─────────────────────────────────────────────────────────────┐
│ forming an isolation structure in the isolation well region │──S230
└─────────────────────────────────────────────────────────────┘
                              ↓
┌─────────────────────────────────────────────────────────────┐
│ forming a field oxide layer on a portion of the power device│
│ drift region, forming a gate electrode on the isolation     │
│ region and the second conductivity type well region,        │
│ wherein the gate electrode extends over the power device    │
│ drift region that is not covered by the field oxide layer,  │──S240
│ and further extends to cover a portion of the field oxide   │
│ layer                                                       │
└─────────────────────────────────────────────────────────────┘
                              ↓
┌─────────────────────────────────────────────────────────────┐
│ forming a power device source region disposed in the        │
│ isolation region and located in the second conductivity     │
│ type, wherein the power device source region extends under  │
│ the gate electrode, forming a power device drain region     │
│ located in the power device drift region, and forming a     │
│ substrate extraction region located on a side of the power  │
│ device source region opposite to the gate electrode,        │
│ wherein the substrate extraction region is disposed in the  │
│ low-voltage device region and located in the second         │
│ conductivity type well region                               │──S250
└─────────────────────────────────────────────────────────────┘
                              ↓
┌─────────────────────────────────────────────────────────────┐
│ leading out a source terminal from the power device source  │
│ region, leading out a drain terminal from the power device  │
│ drain region, and leading out a substrate extraction        │──S260
│ terminal from the substrate extraction region               │
└─────────────────────────────────────────────────────────────┘
```

FIG. 5

SEMICONDUCTOR DEVICE AND MANUFACTURING METHOD THEREOF

TECHNICAL FIELD

The present invention relates to the technical field of semiconductor manufacturing, specifically a semiconductor device and a method for manufacturing the semiconductor device.

BACKGROUND TECHNOLOGY

High-voltage integrated circuits typically include high-voltage integrated circuits, low-voltage integrated circuits, and high-voltage power devices. High-voltage power devices often adopt a racetrack structure where the source surrounds the drain. However, the way these high-voltage power devices have their source connected to low voltage and their drain connected to high voltage results in the high voltage spanning across the drift region of the device, thereby affecting the voltage withstand capability of the device. Additionally, there are also drawbacks such as leakage between the high-voltage integrated circuit and the drain terminal, and excessive device area of the high-voltage integrated circuit.

SUMMARY OF THE INVENTION

The present invention provides a semiconductor device and a manufacturing method thereof.

A semiconductor device, including a high-voltage device region, a low-voltage device region, and an isolation region located between the high-voltage device region and the low-voltage device region. The semiconductor device further includes:
  a drift region, disposed in the high-voltage device region and having a first conductivity type;
  a second conductivity type well region, disposed in the isolation region and extending to the low-voltage device region, wherein the first conductivity type is opposite to the second conductivity type;
  an isolation well region, having the second conductivity type and disposed in the drift region to separate the drift region into a high-voltage drift region and a power device drift region;
  an isolation structure, disposed in the isolation well region and including a conductive structure and a dielectric layer surrounding the bottom surface and side surfaces of the conductive structure;
  a power device source region, disposed in the isolation region and located in the second conductivity type well region, wherein the power device source region has the first conductivity type; and
  a power device drain region, disposed in the power device drift region and having the first conductivity type.

In one embodiment, the power device drift region is within the region surrounded by the isolation well region and the second conductivity type well region.

In one embodiment, the isolation well region is provided with multiple trenches that are spaced apart from each other, wherein the trenches extend from the upper surface of the isolation well region into the isolation well region, and the isolation structure is disposed in each of the trenches.

In one embodiment, the trenches are arranged at equal intervals.

In one embodiment, the trenches further extend to the bottom of the isolation well region.

In one embodiment, the isolation well region is provided with a trench extending from the upper surface of the isolation well region into the isolation well region, wherein the depth of the trench is the same as the depth of the isolation well region, and the isolation structure is disposed in the trench.

In one embodiment, the material of the dielectric layer includes silicon oxide; and/or, the material of the conductive structure includes polysilicon.

In one embodiment, the conductive structure is externally connected to a potential.

In one embodiment, the power device is a laterally diffused metal-oxide-semiconductor field-effect transistor LDMOS.

In one embodiment, the power device further includes:
  a field oxide layer, disposed on the power device drift region;
  a gate electrode, disposed on the field oxide layer and extending to cover a portion of the power device source region;
  a substrate extraction region, having the second conductivity type and disposed in the low-voltage device region and located in the second conductivity type well region.

A method for manufacturing a semiconductor device, including:
  forming a drift region in the high-voltage device region, wherein the drift region has a first conductivity type;
  forming a second conductivity type well region in the isolation region, wherein the second conductivity type well region further extends to the low-voltage device region, and forming an isolation well region in the drift region to separate the drift region into a high-voltage drift region and a power device drift region, wherein the first conductivity type is opposite to the second conductivity type;
  forming an isolation structure in the isolation well region, wherein the isolation structure includes a conductive structure and a dielectric layer surrounding the bottom surface and side surfaces of the conductive structure;
  forming a power device source region, wherein the power device source region is disposed in the isolation region and located in the second conductivity type well region, and forming a power device drain region, wherein the power device drain region is located in the power device drift region, wherein the power device source region and the power device drain region both have the first conductivity type.

In one embodiment, the forming of the isolation structure in the isolation well region includes:
  etching the isolation well region downward to form at least one trench in the isolation well region;
  forming the dielectric layer on the inner walls of each trench;
  forming the conductive structure that fills each trench.

In the method for manufacturing the semiconductor device, due to the arrangement of the isolation structure in the isolation well region, the dielectric layer of the isolation structure provides an electrical isolation during the process where a high-voltage current flows from the high-voltage drift region to the power device, reducing the leakage current flowing from the high-voltage device region to the power device through the high-voltage drift region. Although the provision of new depletion regions between the isolation well region and the high-voltage drift region, as well as between the isolation well region and the power device drift region, increases the electric field peak in the drift region and the substrate near the power device drain region, the conductive structure, dielectric layer, and isolation well region produce a capacitor effect similar to that of a conductive-dielectric-semiconductor structure, which not only assists in depleting the drift region but also restricts the equipotential lines at the bottom of the drift region in the isolation structure when the power device is in reverse blocking state, greatly reducing the electric field peak caused by the introduction of the isolation well region. In this way, the obtained semiconductor device can reduce the leakage current flowing from the high-voltage device area to the power device through the drift area without affecting its voltage withstand capacity.

DESCRIPTION OF DRAWINGS

In order to better describe and illustrate the embodiments and/or examples of the present invention, one or more drawings are provided. Additional details or examples used to describe the drawings should not be considered as limiting the scope of the disclosed invention, the currently described embodiments and/or examples, and the best mode for understanding the present invention.

FIG. 5 shows a flowchart of a method for manufacturing a semiconductor device in another embodiment.

Figure 1:
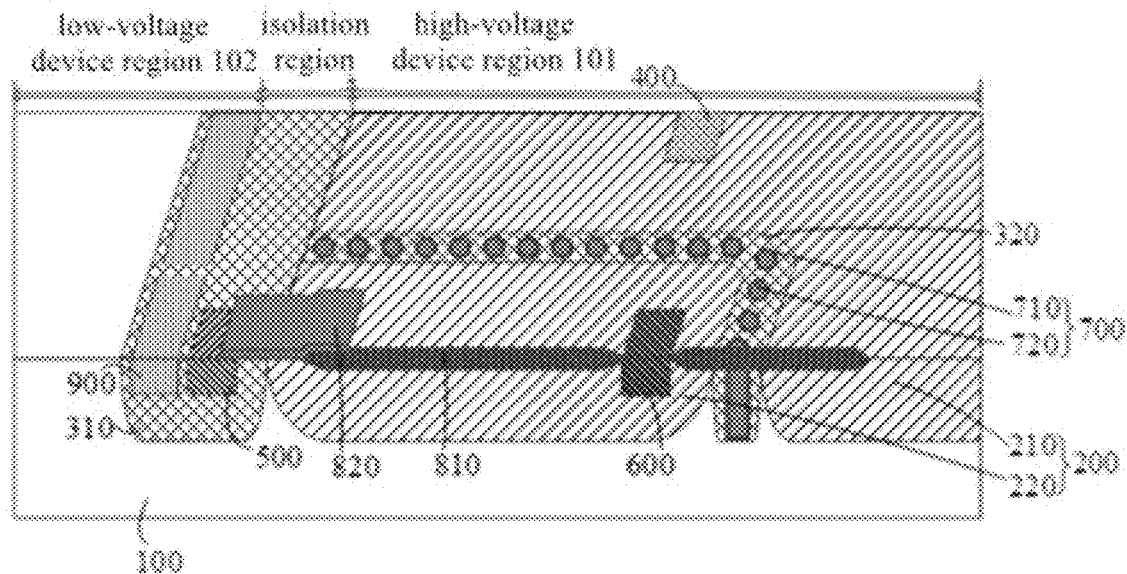
FIG. 1 shows a three-dimensional view of a semiconductor device in one embodiment.

REFERENCE NUMERALS 100 substrate
101 high-voltage device region
102 low-voltage device region
200 drift region
210 high-voltage drift region
220 power device drift region
310 second conductivity type well region
320 isolation well region
400 high-voltage power extraction region
500 power device source region
600 power device drain region
700 isolation structure
710 dielectric layer
720 conductive structure
810 field oxide layer
820 gate electrode
900 substrate extraction region

DETAILED DESCRIPTION

In order to facilitate an understanding of the present invention, the present invention will be more fully described below with reference to the relevant accompanying drawings. Preferred embodiments of the present invention are given in the accompanying drawings. However, the present invention can be realized in many different forms and is not limited to the embodiments described herein. These embodiments are provided to make the disclosure of the present invention more comprehensive.

Unless otherwise defined, all technical and scientific terms used herein have the same meanings as being commonly understood by those skilled in the art belonging to the present invention. The terminology used herein in the specification of the present invention is for the purpose of describing specific embodiments only and is not intended to limit the present invention. As used herein, the term "and/or" includes any and all combinations of one or more of the relevant listed items.

It should be understood that, when an element or layer is referred to as being "on," "adjacent," "connected to" or "coupled to" another element or layer, it can be directly on, adjacent to, connected to, or coupled to another element or layer, or other elements or layers may present therebetween. When the component is referred to as being "directly on", "directly adjacent to", "directly connected to", or "directly coupled to" another element or layer, no other elements or layers present therebetween. It should be understood that, although the terms first, second, third, etc. are used to describe various elements, components, regions, layers and/or sections, these elements, components, regions, layers, and/or sections are not limited by these terms. These terms are only used to distinguish one element, component, region, layer, or section from another element, component, region, layer, or section. Accordingly, without departing from the teachings of the present invention, the first element, component, region, layer, or section discussed below may represent a second element, component, region, layer, or section.

Spatial relation terms such as "under", "below", "underneath", "beneath", "above", "on top of", etc., can be used here for convenience to describe the relationship between one component or feature and other components or features shown in the figures. It should be understood that, in addition to the orientations shown in the drawings, the spatial relation terms also encompass different orientations of the devices during use and operation. For example, if the device in the drawing is turned upside down, then the element or feature described as "under", "beneath", or "below" another element would be oriented "above" the other element or feature. Therefore, the exemplary terms "under" and "below" may encompass both the upper and lower orientations. The device may be oriented differently (eg, rotated 90 degrees or other degrees), and the spatial descriptive terms used herein should be interpreted accordingly.

The terminology used herein is intended to describe specific embodiments only and is not intended to be a limitation of the present invention. When used herein, the singular forms "an", "a", and "said/the" are also intended to include the plural form, unless the context clearly indicates otherwise. It should also be understood that the terms "comprise" and/or "include", when used in this specification, are intended to specify the presence of the features, integers, steps, operations, elements, and/or components, rather than excluding the presence or addition of one or more other features, integers, steps, operations, elements, components, and/or groups. As used herein, the term "and/or" includes any and all combinations of the associated listed items.

Implementations of the present invention are described herein with reference to cross-sectional illustrations that are idealized embodiments (and intermediate structures) of the present invention. In this way, variations of the shape due to, for example, manufacturing techniques and/or tolerances can be expected. Therefore, embodiments of the present invention should not be limited to the specific shapes of the regions shown here but should include deviations in shape due to, for example, manufacturing. For example, an implantation region depicted as rectangular would typically have rounded or curved features and/or injection concentration gradients at its edges, rather than a direct change from the implanted region to the non-implanted region. Similarly, the buried region formed by implantation may result in some implantation in the area between the buried region and the surface through which the implantation occurs. Therefore, the regions shown in the drawings are essentially illustrative, and their shapes are not intended to show the actual shape of the regions of the device and to limit the scope of the present invention.

The semiconductor terminology used in the present invention is commonly used technical terms for professionals in this field. For example, to distinguish doping concentrations, P+ is used to represent the P-type with high doping concentration, P is used to represent the P-type with intermediate doping concentration, and P− is used to represent the P-type with low doping concentration. Similarly, N+ represents the N-type with high doping concentration, N represents the N-type with intermediate doping concentration, and N− represents the N-type with low doping concentration.

Figure 2:
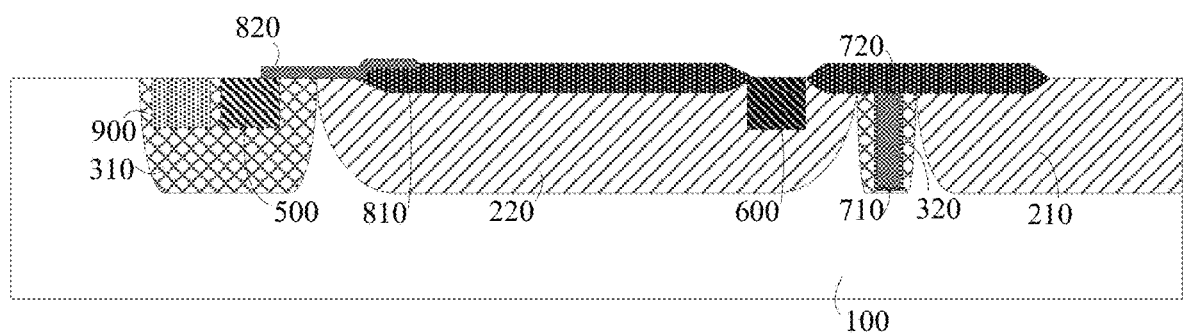
FIG. 2 shows a cross-sectional view of a semiconductor device in one embodiment.

FIG. 1 is a three-dimensional view of a semiconductor device in one embodiment, and FIG. 2 is a cross-sectional view of the semiconductor device in one embodiment.

Please refer to FIGS. 1 and 2. The semiconductor device provided in this embodiment of the present invention includes a high-voltage device region 101, a low-voltage device region 102, and an isolation region located between the high-voltage device region 101 and the low-voltage device region 102. The semiconductor device further includes a drift region 200, a second conductivity type well region 310, an isolation well region 320, a power device source region 500, a power device drain region 600, and an isolation structure 700.

In one embodiment of the present invention, a substrate 100 includes the high-voltage device region 101, the low-voltage device region 102, and the isolation region located between the high-voltage device region 101 and the low-voltage device region 102.

The drift region 200 is disposed in the high-voltage device region 101, and the second conductivity type well region 310 is disposed in the isolation region and extends to the low-voltage device region 102. The drift region 200 has a first conductivity type, which is opposite to the second conductivity type. When the first conductivity type or the second conductivity type is P-type, the other is N-type. For example, the first conductivity type can be N-type, and the second conductivity type can be P-type; or, the first conductivity type can be P-type, and the second conductivity type can be N-type. In one embodiment of the present invention, the first conductivity type is N-type, and the second conductivity type is P-type, then the second conductivity type well region 310 has a conductivity type of P-type, while the drift region 200 has a conductivity type of N-type.

The isolation well region 320 is disposed in the drift region 200 and separates the drift region 200 into a high-voltage drift region 210 and a power device drift region 220. An isolation structure 700 is disposed in the isolation well region 320 and includes a dielectric layer 710 and a conductive structure 720. The dielectric layer 710 surrounds the bottom surface and side surfaces of the conductive structure 720. By providing the dielectric layer 710 in the isolation well region 320, it is easier to balance the doping ions in the drift region 200 and the charges between the isolation structures 700, which facilitates the shifting of the electric field peak from the drift region 200 and the substrate 100 near the power device drain region 600 to the isolation structure 700 in the isolation well region 320, thus effectively preventing the semiconductor device from being prematurely broken down under reverse voltage conditions.

The power device source region 500 is disposed in the isolation region and located in the second conductivity type well region 310 with a first conductivity type. The power device drain region 600 is disposed in the power device drift region 220 with a first conductivity type.

The isolation well region 320 has a second conductivity type, and the high-voltage drift region 210 and the power device drift region 220 have a first conductivity type. A parasitic PN diode is formed between the isolation well region 320 and the high-voltage drift region 210, as well as between the isolation well region 320 and the power device drift region 220. When the device in the high-voltage device region 101 is powered on, during the process of high-voltage current flowing from the high-voltage drift region 210 to the power device, the parasitic PN diode formed between the isolation well region 320 and the power device drift region 220 is reversely biased. The concentration of conductive particles near the interfaces between the isolation well region 320 and the high-voltage drift region 210 as well as between the isolation well region 320 and the power device drift region 220 decreases. This increases the parasitic resistance formed between the isolation well region 320 and the high-voltage drift region 210 as well as between the isolation well region 320 and the power device drift region 220, reducing the conductivity, thereby reducing the leakage current flowing from the high-voltage device region 101 to the power device through the drift region 200.

In the above semiconductor device, due to the presence of the isolation structure 700 in the isolation well region 320, during the process of high-voltage current flowing from the high-voltage drift region 210 to the power device, the dielectric layer 710 of the isolation structure 700 functions as an electrical isolation, reducing the leakage current flowing from the high-voltage device region 101 to the power device through the high-voltage drift region 210. Although a new depletion region is provided between the isolation well region 320 and the high-voltage drift region 210, as well as between the isolation well region 320 and the power device drift region 220, increasing the electric field peak in the drift region 200 and the substrate 100 near the power device drain region 600, the combination of the conductive structure 720, the dielectric layer 710, and the isolation well region 320 creates an effect similar to a capacitor made of a conductive material-dielectric material-semiconductor, which not only assists in depleting the drift region 200 but also restricts the equipotential lines at the bottom of the drift region 200 within the isolation structure 700 during reverse blocking of the power device, significantly reducing the electric field peak caused by the introduction of the isolation well region 320. As a result, this semiconductor device not only reduces the leakage current flowing from the high-voltage device region 101 to the power device through the drift region 200 but also plays no effect on the voltage withstand capability of the semiconductor device.

In one embodiment of the present invention, the semiconductor device further includes a high-voltage power extraction region 400 disposed in the high-voltage drift region 210 for connecting to an external high-voltage power supply.

In one embodiment of the present invention, referring to FIG. 1, the power device drift region 220 is completely enclosed within the region surrounded by the isolation well region 320 and the second conductivity type well region 310.

In one embodiment of the present invention, the isolation well region 320 is connected to the second conductivity type well region 310. In the embodiment shown in FIG. 1, the isolation well region 320 and the second conductivity type well region 310 surround the power device drift region 220 on three sides.

Due to the reverse bias of the parasitic PN diode formed between the isolation well region 320 and the power device drift region 220, the parasitic resistance between the isolation well region 320 and the power device drift region 220 increases. Combined with the isolation well region 320 enclosing the power device drain region 600, during the process of high-voltage current flowing through the drift region 200 to the power device drain region 600, the leakage current flowing into the power device drain region 600 can be better reduced, enhancing the reliability of the semiconductor device.

In one embodiment of the present invention, referring to FIG. 1, the isolation well region 320 is provided with multiple trenches arranged at intervals, extending from the upper surface of the isolation well region 320 into the isolation well region 320, and each trench is provided with the isolation structure 700.

It can be understood that the multiple trenches surround the power device drain region 600, and the provision of the isolation structures 700 in trenches creates an effect similar to a capacitor made of a conductive material-dielectric material-semiconductor, not only assisting in depleting the drift region 200 but also restricting the equipotential lines at the bottom of the drift region 200 within the multiple isolation structures 700 during reverse blocking of the power device. This allows significant reduction of electric field peak caused by the introduction of the isolation well region 320 and reduction of the leakage current flowing into the power device drain region 600, improving the reliability of the semiconductor device and not affecting its voltage withstand capability.

In one embodiment of the present invention, the trenches are arranged at equal intervals, which can make the capacitance between adjacent isolation structures 700 equal.

In one embodiment of the present invention, referring to FIGS. 1 and 2, the trenches further extend to the bottom of the isolation well region 320. In this way, the electrical potential at the top of the conductive structure 720 can be equal to that at the bottom of the conductive structure 720, facilitating the conductive structure 720, the dielectric layer 710, and the isolation well region 320 to produce a capacitor effect similar to that of a conductive material-dielectric material-semiconductor structure. During reverse blocking of the power device, the equipotential line at the bottom of the drift region 200 can be restricted to the bottom of the conductive structure 720, significantly reducing the electric field peak caused by the introduction of the isolation well region 320.

In one embodiment of the present invention, trenches extending from the upper surface of the isolation well region 320 into the isolation well region 320 are provided in the isolation well region 320. The depth of the trenches is the same as that of the isolation well region 320, and an isolation structure 700 is provided within each trench. The provision of the isolation structure 700 creates an effect similar to a capacitor made of a conductive material-dielectric material-semiconductor, which not only assists in depleting the drift region 200 but also restricts the equipotential line at the bottom of the drift region 200 in the isolation structure 700 during reverse blocking of the power device, significantly reducing the electric field peak caused by the introduction of the isolation well region 320, better reducing the leakage current flowing into the power device drain region 600, and improving the reliability of the semiconductor device while not affecting its voltage withstand capability.

In one embodiment of the present invention, the material of the dielectric layer 710 includes silicon oxide. Silicon oxide is an insulating material, thus setting an insulating material between the high-voltage drift region 210 and the power device drift region 220 for electrical isolation can better reduce the leakage current flowing from the high-voltage device region 101 to the power device drain region 600 through the high-voltage drift region 210. Exemplarily, the silicon oxide is $SiO_2$.

In one embodiment of the present invention, the material of the conductive structure 720 includes polysilicon. Using polysilicon material is easier to fill the trenches, and the obtained trenches are relatively stable. Furthermore, polysilicon material can directly achieve the desired resistance value through impurity injection or in-situ doping (in-situ doping method makes it easier to adjust the resistance of the conductive structure 720). In other embodiments, the material of the conductive structure 720 may also adopt other conductive materials known in the field.

In one embodiment of the present invention, the conductive structure 720 is externally connected to a potential source for applying a forward voltage when the device in the high-voltage device region 101 is powered on.

As previously described, the provision of the isolation structure 700 can creates an effect similar to a capacitor made of a conductive material-dielectric material-semiconductor. When the device in the high-voltage device region 101 is powered on, a high voltage is applied to the high-voltage device region 101 and the power device drain region 600, causing depletion in the power device drift region 220. By applying a forward voltage to the conductive structure 720 to assist in depleting the isolation well region 320, this can prevent electric field lines from concentrating in the power device drift region 220 caused by the introduction of the isolation well region 320, reducing leakage current while hardly affecting the voltage withstand level.

In one embodiment of the present invention, the power device is a laterally diffused metal-oxide-semiconductor field-effect transistor LDMOS.

A portion of the high-voltage device region 101 and a portion of the low-voltage device region 102 are used to form an LDMOS, and the portion of the drift region 200 that is not surrounded by the isolation well region 320 still belongs to the high-voltage device region 101. In other words, the present invention provides an LDMOS in the region between the high-voltage device region 101 and the low-voltage device region 102. Therefore, there is no need for a separate region to specifically accommodate the LDMOS, saving device area and improving chip integration. At the same time, a racetrack structure, where the source surrounds the drain, of the LDMOS is avoided, eliminating the issue of affecting device voltage withstand capacity due to high-voltage current flowing into the drift region 200.

In one embodiment of the present invention, the LDMOS, the devices in the high-voltage device region 101, and the devices in the low-voltage device region 102 belong to the same drive circuit, and the LDMOS is used for level shifting. In one embodiment of the present invention, the power device further includes a field oxide layer 810, a gate electrode 820, and a substrate extraction region 900. The field oxide layer 810 is disposed on a portion of the power device drift region 220, and the gate electrode 820 is disposed on the second conductivity type well region 310 in the isolation region. One end of the gate electrode 820 extends over the field oxide layer 810, and the other end of the gate electrode 820 extends to cover a portion of the power device source region 500. The substrate extraction region 900 is disposed in the low-voltage device region 102 and located in the second conductivity type well region 310. The substrate extraction region 900 is positioned on the side of the power device source region 500 opposite to the gate electrode 820, and spaced apart from the power device source region 500. The substrate extraction region 900 has a second conductivity type. It should be noted that in FIG. 1, only one side of the field oxide layer 810 is depicted to illustrate the top view structure of the isolation well region 320 and the isolation structure 700.

The power device source region 500 is led out as the source electrode of the power device, the power device drain region 600 is led out as the drain electrode of the power device, and the substrate extraction region 900 is used to lead out the substrate terminal of the power device.

Figure 3:
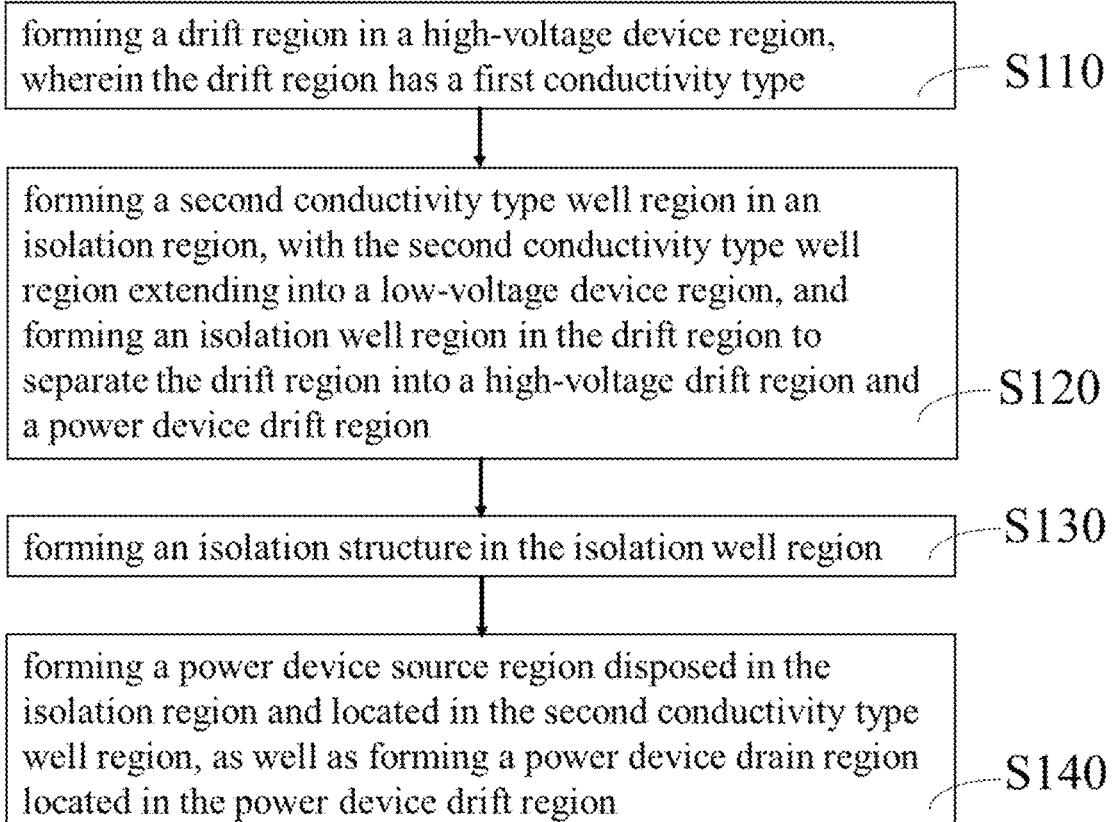
FIG. 3 shows a flowchart of a method for manufacturing a semiconductor device in one embodiment.

One end of the gate electrode 820 extends to cover a portion of the power device source region 500. During the formation of the power device, the gate electrode 820 can serve as an injection barrier for the implantation doping of the power device source region 500, thus enabling self-aligned implantation of the power device source region 500 and ensuring the width of the conductive trenches in the power device. The present invention accordingly provides a method for manufacturing the semiconductor device described in any of the preceding embodiments. FIG. 3 is a flowchart of a method for manufacturing a semiconductor device in one embodiment, including the following steps:

S110, forming a drift region in a high-voltage device region, wherein the drift region has a first conductivity type.

S120, forming a second conductivity type well region in an isolation region, with the second conductivity type well region extending into a low-voltage device region, and forming an isolation well region in the drift region to separate the drift region into a high-voltage drift region and a power device drift region, wherein the first conductivity type is opposite to the second conductivity type.

S130, forming an isolation structure in the isolation well region, wherein the isolation structure includes a conductive structure and a dielectric layer surrounding a bottom surface and side surfaces of the conductive structure.

S140, forming a power device source region disposed in the isolation region and located in the second conductivity type well region, as well as forming a power device drain region located in the power device drift region, wherein both the power device source region and the power device drain region have the first conductivity type.

The semiconductor device manufactured from this method can reduce the leakage current flowing from the high-voltage device region to the power device through the drift region without affecting the voltage withstand capacity of the semiconductor device.

In one embodiment of the present invention, before step S110, the method includes: providing a substrate 100, wherein the substrate 100 comprises the high-voltage device region 101, the low-voltage device region 102, and the isolation region located between the high-voltage device region 101 and the low-voltage device region 102.

Figure 4:
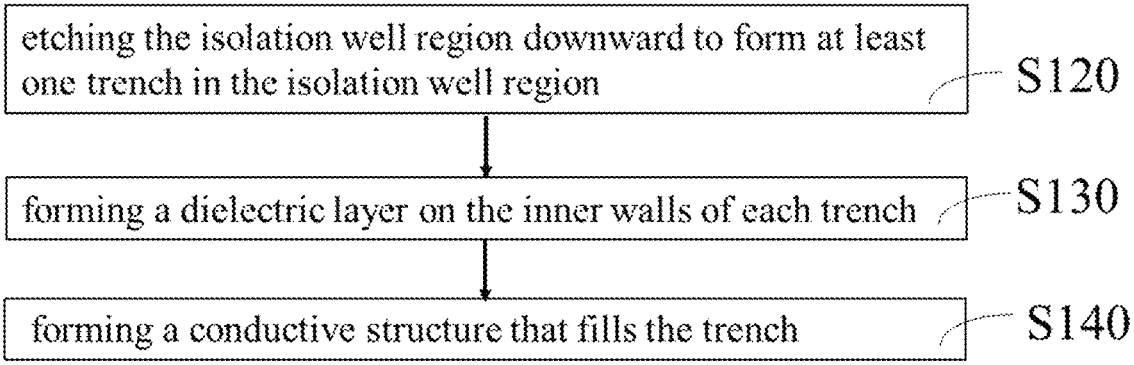
FIG. 4 shows a flowchart of a method for manufacturing a semiconductor device in one embodiment.

In one embodiment of the present invention, referring to FIG. 4, the forming of the isolation structure in the isolation well region, including:

S131, etching the isolation well region downward to form at least one trench in the isolation well region.

S132, forming a dielectric layer on the inner walls of each trench.

S133, forming a conductive structure that fills the trench.

In some embodiments, the material of the dielectric layer is silicon oxide, such as $SiO_2$. The material of the conductive structure is polysilicon.

In one embodiment of the present invention, a long strip-shaped trench extending from the upper surface of the isolation well region into the isolation well region is formed in the isolation well region, and the depth of the trench is the same as the depth of the isolation well region. The isolation structure is formed within the trench.

In one embodiment of the present invention, a silicon oxide layer can be formed on the inner walls of the trench as a dielectric layer through thermal oxidation. In other embodiments, the dielectric layer can also be formed on the inner walls of the trench through other processes known in the art.

In one embodiment of the present invention, the conductive structure in the trench is made of polysilicon. Polysilicon with a certain doping concentration can be deposited into the trench through a deposition process to form the conductive structure on the dielectric layer.

In one embodiment of the present invention, the doping concentration of the polysilicon can be adjusted by a doping process, such as in-situ doping, thereby adjusting the resistance value of the polysilicon In one embodiment of the present invention, the top of the trench is flush with the top of the drift region, and thus, the top of the conductive structure in the trench is also flush with the top of the drift region. In this way, it can better reduce the leakage current flowing from the high-voltage device region to the power device through the drift region.

In one embodiment of the present invention, the forming of the isolation structure in the isolation well region, including:

etching downward the isolation well region to form multiple trenches spaced apart along the extension direction of the isolation well region.

forming a dielectric layer on the inner walls of each trench.

forming a conductive structure that fills each trench.

In one embodiment of the present invention, by performing a doping process, first conductivity type ions are implanted into a partial upper surface layer of the second conductivity type well region, forming a power device source region in the partial upper surface layer of the second conductivity type well region.

In one embodiment of the present invention, by performing a doping process, first conductivity type ions are implanted into a partial upper surface layer of the power device drift region, forming a power device drain region in the partial upper surface layer of the power device drift region.

FIG. 5 is a flowchart illustrating a method for manufacturing a semiconductor device in another embodiment.

In one embodiment of the present invention, please refer to FIG. 5, the method for manufacturing the semiconductor device includes:

S210, forming a drift region in a high-voltage device region, wherein the drift region has a first conductivity type.

S220, forming a second conductivity type well region in an isolation region, wherein the second conductivity type well region further extends to a low-voltage device region, and forming an isolation well region in the drift region to separate the drift region into a high-voltage drift region and a power device drift region, wherein the first conductivity type is opposite to the second conductivity type.

S230, forming an isolation structure in the isolation well region, wherein the isolation structure includes a conductive structure and a dielectric layer surrounding a bottom surface and side surfaces of the conductive structure.

S240, forming a field oxide layer on a portion of the power device drift region, forming a gate electrode on the isolation region and the second conductivity type well region, wherein the gate electrode extends over the power device drift region that is not covered by the field oxide layer, and further extends to cover a portion of the field oxide layer.

S250, forming a power device source region disposed in the isolation region and located in the second conductivity type, wherein the power device source region extends under the gate electrode, forming a power device drain region located in the power device drift region, and forming a substrate extraction region located on a side of the power device source region opposite to the gate electrode, wherein the substrate extraction region is disposed in the low-voltage device region and located in the second conductivity type well region. The power device source region and the power device drain region both have a first conductivity type, and the substrate extraction region is spaced apart from the power device source region and has a second conductivity type.

S260, leading out a source terminal from the power device source region, leading out a drain terminal from the power device drain region, and leading out a substrate extraction terminal from the substrate extraction region.

In one embodiment of the present invention, the power device source region and the power device drain region are N+ doped regions, and the substrate extraction region is a P+ doped region.

In one embodiment of the present invention, an oxide layer can be formed as the field oxygen layer on the power device drift region by depositing and patterning.

In one embodiment of the present invention, the step of forming the field oxygen layer is followed by the step of forming the gate electrode. In one embodiment of the present invention, the forming of the field oxygen layer can include first forming a gate dielectric layer and then forming a gate conductive layer on the gate dielectric layer, wherein the gate electrode includes the gate dielectric layer and the gate conductive layer.

In one embodiment of the present invention, the material of the gate dielectric layer is silicon oxide, such as $SiO_2$, and the material of the gate electrode is polysilicon.

In the method for manufacturing the semiconductor device, due to the arrangement of the isolation structure in the isolation well region and the dielectric layer in the isolation structure, the dielectric layer of the isolation structure provides an electrical isolation during the process where a high-voltage current flows from the high-voltage drift region to the power device, reducing the leakage current flowing from the high-voltage device region to the power device through the high-voltage drift region. Although the provision of new depletion regions between the isolation well region and the high-voltage drift region, as well as between the isolation well region and the power device drift region, increases the electric field peak in the drift region and the substrate near the power device drain region, the conductive structure, dielectric layer, and isolation well region produce a capacitor effect similar to that of a conductive-dielectric-semiconductor structure, which not only assists in depleting the drift region but also restricts the equipotential lines at the bottom of the drift region in the isolation structure during reverse blocking of the power device, significantly reducing the electric field peak caused by the introduction of the isolation well region. Therefore, the obtained semiconductor device can reduce the leakage current flowing from the high-voltage device region to the power device through the drift region without affecting the voltage withstand capacity of the semiconductor device.

It should be understood that, although the individual steps in the flowchart of the present invention are shown sequentially as indicated by the arrows, the steps are not necessarily implemented sequentially in the order indicated by the arrows. Unless expressly stated herein, there is no strict sequential limitation on the performance of these steps, and these steps may be performed in other orders. Moreover, at least a portion of the steps in the flowchart of the present invention may comprise multiple steps or multiple stages, which are not necessarily completed at the same moment but may be executed at different moments, and the execution order of these steps or stages does not necessarily have to be sequential; they can be performed alternately or concurrently with at least some parts of other steps or stages.

In the description of this specification, reference terms such as "some embodiments," "other embodiments," "ideal embodiments," and the like mean that specific features, structures, materials, or characteristics described in conjunction with the embodiment or example are included in at least one embodiment or example of the present invention. In this specification, the schematic description of the above terms does not necessarily refer to the same embodiments or examples.

The various technical features of the embodiments described above can be combined in any manner. To simplify the description, not all possible combinations of the technical features of the embodiments are described. However, it should be considered that all combinations of these technical features, without conflict, are within the scope of the specification.

The embodiments of the present invention are discussed above but are not used to limit the present invention. The person skilled in the art can make various changes or modification to the present disclosure. Any modification or improvement made within the spirit and principle of the present invention shall be within the protection scope of the present invention. Additionally, the protection scope of the present invention should be determined by the claims.

The invention claimed is:

1. A semiconductor device, comprising a high-voltage device region, a low-voltage device region, and an isolation region disposed between the high-voltage device region and the low-voltage device region, wherein the semiconductor device further comprises:

a drift region, disposed in the high-voltage device region and having a first conductivity type;

a second conductivity type well region, disposed in the isolation region and extending to the low-voltage device region, wherein the first conductivity type is opposite to a second conductivity type;

an isolation well region, having the second conductivity type and disposed in the drift region to separate the drift region into a high-voltage drift region and a power device drift region;

an isolation structure, disposed in the isolation well region and including a conductive structure and a dielectric layer surrounding a bottom surface and side surfaces of the conductive structure;

a power device source region, disposed in the isolation region and located in the second conductivity type well region, wherein the power device source region has the first conductivity type; and a power device drain region, disposed in the power device drift region and having the first conductivity type.

2. The semiconductor device according to claim 1, wherein the power device drift region is within a region enclosed by the isolation well region and the second conductivity type well region.

3. The semiconductor device according to claim 1, wherein the isolation well region is provided with multiple trenches that are spaced apart, the trenches extend from an upper surface of the isolation well region into the isolation well region, and the isolation structure is disposed in each of the trenches.

4. The semiconductor device according to claim 3, wherein the trenches are arranged at equal intervals.

5. The semiconductor device according to claim 3, wherein the trenches further extend to a bottom of the isolation well region.

6. The semiconductor device according to claim 2, wherein the isolation well region is provided with a trench extending from an upper surface of the isolation well region into the isolation well region, wherein the depth of the trench is the same as the depth of the isolation well region, and the isolation structure is disposed in the trench.

7. The semiconductor device according to claim 1, wherein the material of the dielectric layer comprises silicon oxide; and/or, the material of the conductive structure comprises polysilicon.

8. The semiconductor device according to claim 1, wherein the conductive structure is connected to an external potential.

9. The semiconductor device according to claim 1, wherein the semiconductor device further comprises a high-voltage power extraction region, and the high-voltage power extraction region is disposed in the high-voltage drift region.

10. The semiconductor device according to claim 1, wherein a power device is a laterally diffused metal-oxide-semiconductor field-effect transistor LDMOS.

11. The semiconductor device according to claim 10, wherein the power device further comprises:
a field oxide layer, disposed on the power device drift region;
a gate electrode, disposed on the field oxide layer and extending to cover a portion of the power device source region;
a substrate extraction region, having the second conductivity type and disposed in the low-voltage device region and located in the second conductivity type well region.

12. A method for manufacturing a semiconductor device, comprising:
forming a drift region in a high-voltage device region, wherein the drift region has a first conductivity type;
forming a second conductivity type well region in an isolation region, wherein the second conductivity type well region further extends to a low-voltage device region, and forming an isolation well region in the drift region to separate the drift region into a high-voltage drift region and a power device drift region, wherein the first conductivity type is opposite to a second conductivity type;
forming an isolation structure in the isolation well region, wherein the isolation structure comprises a conductive structure and a dielectric layer surrounding a bottom surface and side surfaces of the conductive structure;
forming a power device source region, wherein the power device source region is disposed in the isolation region and located in the second conductivity type well region, and
forming a power device drain region, wherein the power device drain region is located in the power device drift region, wherein the power device source region and the power device drain region both have the first conductivity type.

13. The method according to claim 12, wherein before the forming of the drift region in the high-voltage device region, the method further comprises: providing a substrate comprising the high-voltage device region, the low-voltage device region, and the isolation region, wherein the isolation region is located between the high-voltage device region and the low-voltage device region.

14. The method according to claim 12, wherein the forming of the isolation structure in the isolation well region comprises:
etching downward the isolation well region to form at least one trench in the isolation well region;
forming the dielectric layer on the inner walls of each trench;
forming the conductive structure that fills each trench.

15. The method according to claim 14, wherein a top of the trench is flush with a top of the drift region.

* * * * *